United States Patent
Xiong et al.

(10) Patent No.: US 9,450,621 B2
(45) Date of Patent: Sep. 20, 2016

(54) DIGITAL PREDISTORTION PROCESSING METHOD AND SYSTEM

(71) Applicant: DATANG MOBILE COMMUNICATIONS EQUIPMENT CO., LTD, Beijing (CN)

(72) Inventors: Jun Xiong, Beijing (CN); Yongli Zhang, Beijing (CN); Bin Xue, Beijing (CN)

(73) Assignee: DATANG MOBILE COMMUNICATIONS EQUIPMENT CO., LTD (CN)

( * ) Notice: Subject to any disclaimer, the term of this patent is extended or adjusted under 35 U.S.C. 154(b) by 0 days.

(21) Appl. No.: 14/761,362

(22) PCT Filed: Dec. 25, 2013

(86) PCT No.: PCT/CN2013/090475
§ 371 (c)(1),
(2) Date: Jul. 16, 2015

(87) PCT Pub. No.: WO2014/110961
PCT Pub. Date: Jul. 24, 2014

(65) Prior Publication Data
US 2015/0358039 A1 Dec. 10, 2015

(30) Foreign Application Priority Data
Jan. 16, 2013 (CN) .......................... 2013 1 0015605

(51) Int. Cl.
*H04B 1/04* (2006.01)
*H03F 1/32* (2006.01)
*H04B 1/62* (2006.01)
*H04L 25/49* (2006.01)

(52) U.S. Cl.
CPC .......... *H04B 1/0475* (2013.01); *H03F 1/3247* (2013.01); *H04B 1/62* (2013.01); *H04L 25/49* (2013.01); *H04B 2001/0433* (2013.01)

(58) Field of Classification Search
CPC ................... H04B 1/0475; H04B 2001/0425; H04B 1/62; H04L 25/49; H03F 1/3247
USPC ................ 375/297; 455/114.3, 126; 330/149
See application file for complete search history.

(56) References Cited

U.S. PATENT DOCUMENTS

2010/0308910 A1* 12/2010 Barnes .................. H03F 1/3247
330/149
2012/0147993 A1* 6/2012 Kim ...................... H03F 1/3247
375/297

FOREIGN PATENT DOCUMENTS

| CN | 101162913 A | 4/2008 |
|---|---|---|
| CN | 101355536 A | 1/2009 |
| CN | 102195912 A | 9/2011 |
| CN | 103051574 A | 4/2013 |

\* cited by examiner

*Primary Examiner* — Betsy Deppe
(74) *Attorney, Agent, or Firm* — Morriss O'Bryant Compagni, PC

(57) ABSTRACT

A digital predistortion processing method and system comprises extracting from a predistortion coefficient parameter table a predistortion parameter corresponding to an input signal, so as to predistort the input signal and obtain a forward transmission signal; amplifying the power of the forward transmission signal to obtain an output signal; acquiring the output signal to obtain a feedback signal; delaying a predetermined number of sampling points so as to acquire the forward transmission signal and obtain a reference signal; conducting synchronization-related calculation on the reference signal and the feedback signal, and calibrating the feedback signal; training a predistortion coefficient according to the reference signal and the calibrated feedback signal; and forming the predistortion coefficient parameter table according to the predistortion coefficient and the amplitude of the input signal. The present invention can delay a predetermined number of sampling points for a transmission signal, thus greatly improving radio frequency index (ACPR).

10 Claims, 8 Drawing Sheets

DIGITAL PREDISTORTION PROCESSING METHOD AND SYSTEM

CROSS-REFERENCE TO RELATED APPLICATIONS

This application is a national phase entry under 35 U.S.C. §371 of PCT/CN2013/090475 filed on Dec. 25, 2013, which claims priority to Chinese Patent Application No. 201310015605.3 filed on Jan. 16, 2013, the entirety of each of which is incorporated by this reference.

TECHNICAL FIELD

The present invention relates to the technical field of communications, and particularly relates to a digital predistortion processing method and system.

BACKGROUND

In a wireless communication system, the output of a power amplifier (Power Amplifier, PA) is generally required to have very high linearity to meet the stringent requirements of air interface standards, but a linear PA is inefficient and very expensive, and an efficient nonlinear PA will produce third-order, fifth-order, seventh-order or other intermodulation components, which will interfere with adjacent channels. In order to improve the output efficiency of the PA and reduce the cost as much as possible, the nonlinear characteristics of the PA must be calibrated, and performing predistortion processing on the input signal of the PA is a good choice.

The essence of digital predistortion (Digital Predistortion, DPD) is to perform preset anti-distortion on the amplitude and phase of the input signal of the power amplifier in advance to counteract the nonlinearity of the power amplifier. The specific implementation manner is as follows: comparing a feedback signal y(n) of the power amplifier with a forward transmission signal z(n), obtaining a group of coefficients by reasonably modeling the power amplifier to approximately characterize the nonlinear characteristics of the power amplifier, and then performing nonlinear predistortion on a transmission signal x(n) via the coefficients and the model, such that the power amplified output signal of a pre-distorted signal is linear amplification of an original transmission signal, y(n)=Gx(n).

Since the power amplifier model in the exiting DPD algorithm generally adopts a memory polynomial (Memory Polynomial MP) model, a mathematical model of the MP model for performing signal predistortion processing is:

$$z(n) = \sum_{m=0}^{M} x(n-m) \sum_{k=1}^{K} w_{m,q} |x(n-m)|^{(k-1)}$$

$$= \sum_{m=0}^{M} x(n-m) \cdot LUT_m(|x(n-m)|)$$

$$= \sum_{m=0}^{M} x(n-m) \cdot LUT_m(Q(r_{n,m}))$$

wherein $$LUT_m(|x(n-m)|) = \sum_{k=1}^{K} w_{m,k} |x(n-m)|^{(k-1)},$$

$$m = 1 \ldots M, n = 1 \ldots N, k = 1 \ldots K;$$

K refers to a nonlinear factor and is a natural number, and the value is 3-7; M refers to a memory depth and is a natural number, and the value is 3-6; N refers to the number of sampling points and is a natural number, and the value is generally 4096-16384.

z(n) refers to a forward sending signal obtained after predistortion processing of the input signal; Q(•) refers to a quantization factor, $r_{n,m}$ refers to the amplitude of the input signal: $r_{n,m}=|x(n-m)|$; $LUT_m(|x(n-m)|)$ refers to a corresponding predistortion parameter with the input signal amplitude $|x(n-m)|$ as an index, and the input address of the $LUT_m(|x(n-m)|)$ is determined according to the quantified amplitude $Q(r_{n,m})$ of the input signal; $W_{m,k}$ refers to a predistortion coefficient calculated by DPD adaptive filtering; after calculating the $W_{m,k}$, a predistortion module may calculate a predistortion signal y(n). When performing predistortion update, a DPD module stores a predistortion parameter according to $|x(n-m)|$, and extracts the predistortion parameter according to $|x(n-m)|$ during predistortion processing. After each DPD coefficient calculation, all DPD parameters stored in an LUT parameter list will be updated once. Specifically, after the predistortion coefficient is calculated, the updated LUT parameter list is obtained by means of the following algorithm:

$$LUT_m(r) = A \cdot \sum_{k=1}^{K} w_{m,k} \cdot (r \cdot Q)^{(k-1)}$$

$$r = 1, \ldots R$$

$$m = 1, \ldots M$$

wherein, R refers to the length of the LUT parameter list stored by a primary memory factor, for example, is generally 256, 512 or the like. The quantification factor Q is equal to the maximum signal /R capable of being stored by the system, for example, Q=32768/R, if R=512, then Q=64.

The above-mentioned model may well respond to the nonlinearity of the power amplifier under general conditions. But for a wideband long term evolution (Long Term Evolution, LTE) 40 MHz system or a wider system, the left and right difference in adjacent channel power ratio (Adjacent Channel Power Ratio, ACPR) is large and the effect is poor. Because signals adopted in wideband DPD technology are high speed sampling signals, the requirements on delay are very high and good accuracy is needed. Moreover, with the change of time and temperature, the power amplifier devices will jitter due to delay, and even if very small jitter will generate a relatively large error in the predistortion processing.

In the prior art, it is proposed to correctly extract a nonlinearly distorted delayed synchronous loop circuit overlapped on the output of a digital predistortion wireless transmitter, in order to achieve synchronous transmission and reception. However, after predistortion synchronization, whether to perform further out-of-step processing and calibration on the synchronized signal is not mentioned, thus the DPD effect could not be improved by delay.

Since the input signal is usually a low speed baseband signal, but the digital predistortion needs to work at a high rate, interpolation filtering needs to be performed on the input baseband signal to improve the rate of the input signal, in order to get a better predistortion effect, the input signal generally needs to be interpolated to improve the rate of the input signal, for example, the interpolation multiple of LTE-time division duplexing (Time Division Duplexing, TDD) is 48, and the intermediate frequency rate is 245.76 MHz, but a problem is brought that the delay is required to be very accurate and is better to be accurate to a clock cycle. On one hand, the round-trip time of a link is very difficult to measure in the prior art, on the other hand, even if the round-trip time may be accurately measured, with the change of time and temperature of the devices, the delay will jitter, and even if very small jitter will generate a relatively large error in the predistortion processing.

SUMMARY

The technical problem to be solved in the present invention is to provide a digital predistortion processing method and system, for perfecting the radio frequency indexes of a wideband system.

To solve the above-mentioned problem, on one hand, the present invention provides a digital predistortion processing method, including:

extracting a predistortion parameter corresponding to an input signal from a predistortion coefficient parameter list to perform predistortion processing on the input signal to obtain a forward sending signal;

performing power amplification processing on the forward sending signal to obtain an output signal;

collecting the output signal to obtain a feedback signal;

collecting the forward sending signal after delaying for a preset number of sampling points to obtain a reference signal;

performing synchronous correlation calculation on the reference signal and the feedback signal to calibrate the feedback signal;

training a predistortion coefficient according to the reference signal and the calibrated feedback signal;

forming a predistortion coefficient parameter list according to the predistortion coefficient and the amplitude of the input signal.

Preferably, the step of performing synchronous correlation calculation on the reference signal and the feedback signal to calibrate the feedback signal further includes:

performing the synchronous correlation calculation on the reference signal and the feedback signal to achieve delay calibration, amplitude calibration and frequency calibration of the feedback signal and obtain the maximum peak point information of correlated peaks;

performing phase calibration on the feedback signal via the phase of a signal corresponding to the maximum peak point.

Preferably, before performing the synchronous correlation calculation, the method further includes a step of judging the power of the feedback signal, if the power of the feedback signal is not less than a set power threshold, continuing to implement the subsequent steps; otherwise, indicating that the feedback signal is abnormal, and terminating the method.

Preferably, the maximum peak point information of correlated peaks includes the amplitude of the maximum peak of the correlated peaks, and the step of obtaining the maximum peak point information of the correlated peaks includes: judging whether the amplitude of the maximum peak of the correlated peaks is larger than a set threshold, if so, continuing to implement the subsequent steps; if not, finding the maximum peak point information of the correlated peaks again.

Preferably, after the step of performing amplitude calibration on the feedback signal, the method further includes: judging whether the peak power of the feedback signal after amplitude calibration is lower than a set value of reference signal peak power, if not, continuing to implement the subsequent steps; if so, indicating that the feedback signal is excessively compressed, and terminating the method.

Preferably, the step of collecting the output signal to obtain the feedback signal includes: removing the rated linear gain of the collected output signal to obtain the feedback signal.

Preferably, the preset number in the delaying for a preset number of sampling points is an integer from −5 to 5.

Preferably, the preset number is 1 or 2.

Preferably, the step of training the predistortion coefficient according to the reference signal and the calibrated feedback signal includes: figuring out the predistortion coefficient by using a memory polynomial model.

On the other hand, the present invention further provides a digital predistortion processing system, including:

a predistortion processor, configured to extract a predistortion parameter corresponding to an input signal from a predistortion coefficient parameter list to perform predistortion processing on the input signal to obtain a forward sending signal;

a digital to analogue converter and a radio frequency transmission channel, configured to perform digital to analogue conversion on the forward sending signal and send the forward sending signal to a power amplifier;

the power amplifier, configured to perform power amplification on the forward sending signal after digital to analogue conversion to obtain an output signal;

a radio frequency receiving channel and an analogue to digital converter, configured to receive the output signal, perform analogue to digital conversion on the output signal and send the output signal to a receiving end capture data controller;

the receiving end capture data controller, configured to collect the output signal after the analogue to digital conversion to obtain a feedback signal;

a sending end capture data controller, configured to collect the forward sending signal after delaying for a preset number of sampling points to obtain a reference signal, and send the reference signal to a synchronous correlation processor;

the synchronous correlation processor, configured to perform synchronous correlation calculation on the reference signal and the feedback signal, calibrate the feedback signal, and then send the feedback signal to a predistortion coefficient training module together with the reference signal;

the predistortion coefficient training module, configured to train a predistortion coefficient according to the reference signal and the calibrated feedback signal, and send the predistortion parameter to a predistortion parameter memory and the predistortion processor;

the predistortion parameter memory, configured to form a predistortion coefficient parameter list according to the predistortion coefficient and the amplitude of the corresponding input signal.

In the present invention, on the basis of increasing no hardware resource or software processing complexity, the simple MP model is still used, therefore the radio frequency index ACPR may be greatly perfected just by delaying the transmission signal for a preset number of sampling points.

In the present invention, the phase of the signal corresponding to the maximum peak point is used as a calibration phase to perform phase calibration on the feedback signal, thus ensuring the phase uniformity of the signals and preventing the phase of the predistortion coefficient from overturning again.

BRIEF DESCRIPTION OF THE DRAWINGS

To illustrate technical solutions in the embodiments of the present invention or in the prior art more clearly, a brief introduction on the accompanying drawings which are needed in the description of the embodiments or the prior art is given below. Apparently, the accompanying drawings in the description below are merely some of the embodiments of the present invention, based on which other drawings may be obtained by those of ordinary skill in the art without any creative effort.

DETAILED DESCRIPTION OF THE PREFERRED EMBODIMENTS

In order that the purposes, technical solutions and advantages of the present invention are clearer, the technical solutions in the embodiments of the present invention will be clearly described below in combination with the accompanying drawings in the embodiments of the present invention. Apparently, the embodiments described are merely a part, but not all, of the embodiments of the present invention. All of other embodiments, obtained by those of ordinary skill in the art based on the embodiments of the present invention without any creative effort, fall into the protection scope of the present invention.

The present invention is illustrated below in detail in combination with the accompanying drawings and the embodiments.

Figure 1:
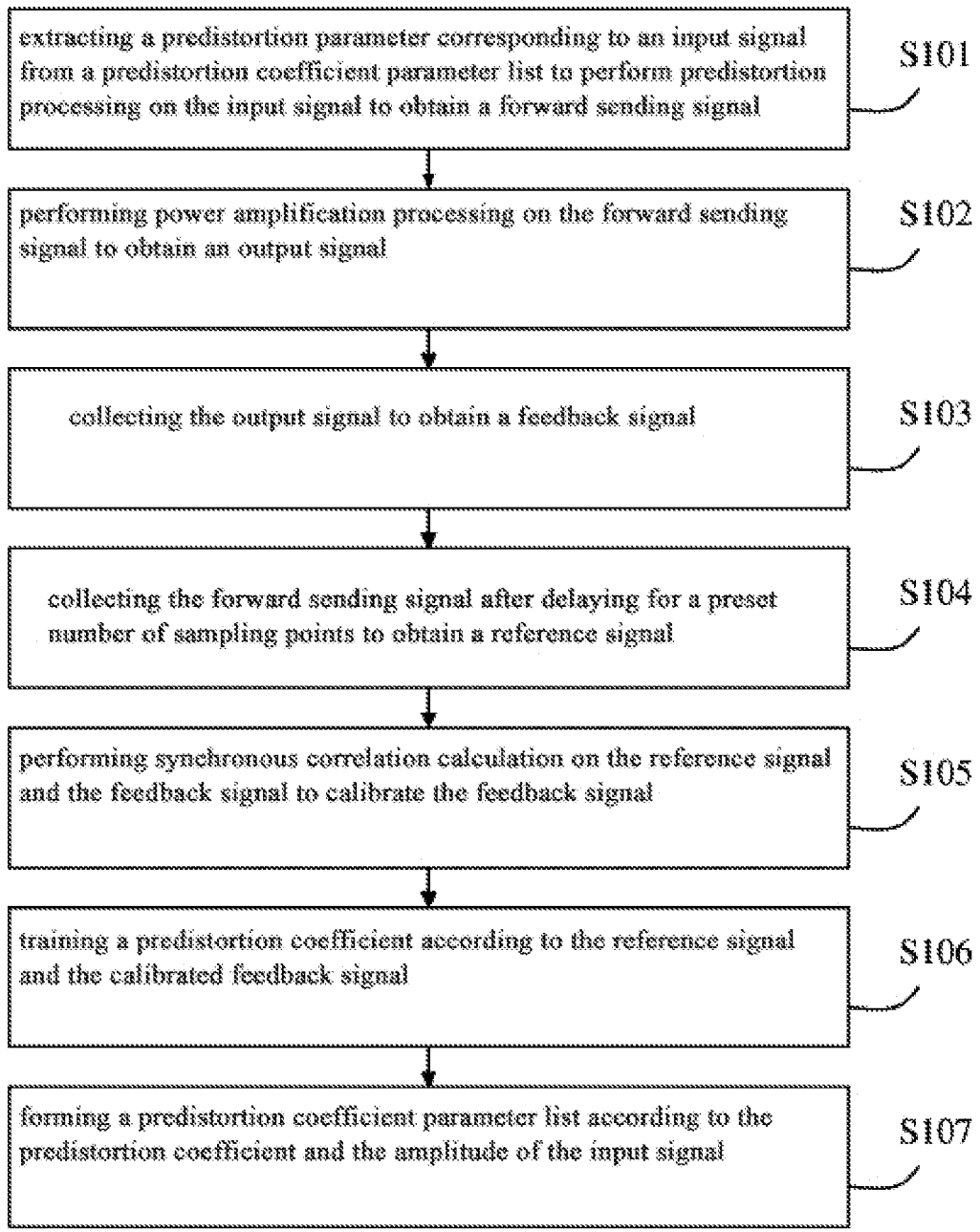
FIG. 1 is a flowchart of a digital predistortion processing method in an embodiment of the present invention.

Embodiment 1:

FIG. 1 is a flowchart of a digital predistortion processing method in this embodiment. The method includes:

S101: extracting a predistortion parameter corresponding to an input signal from a predistortion coefficient parameter list to perform predistortion processing on the input signal to obtain a forward sending signal;

S102: performing power amplification processing on the forward sending signal to obtain an output signal;

S103: collecting the output signal to obtain a feedback signal;

S104: collecting the forward sending signal after delaying for a preset number of sampling points to obtain a reference signal;

S105: performing synchronous correlation calculation on the reference signal and the feedback signal to calibrate the feedback signal;

S106: training a predistortion coefficient according to the reference signal and the calibrated feedback signal;

S107: forming a predistortion coefficient parameter list according to the predistortion coefficient and the amplitude of the input signal.

In the present invention, on the basis of increasing no hardware resource or software processing complexity, the simple MP model is still used, therefore the radio frequency index ACPR may be greatly perfected just by delaying the transmission signal for a preset number of sampling points.

Figure 2:
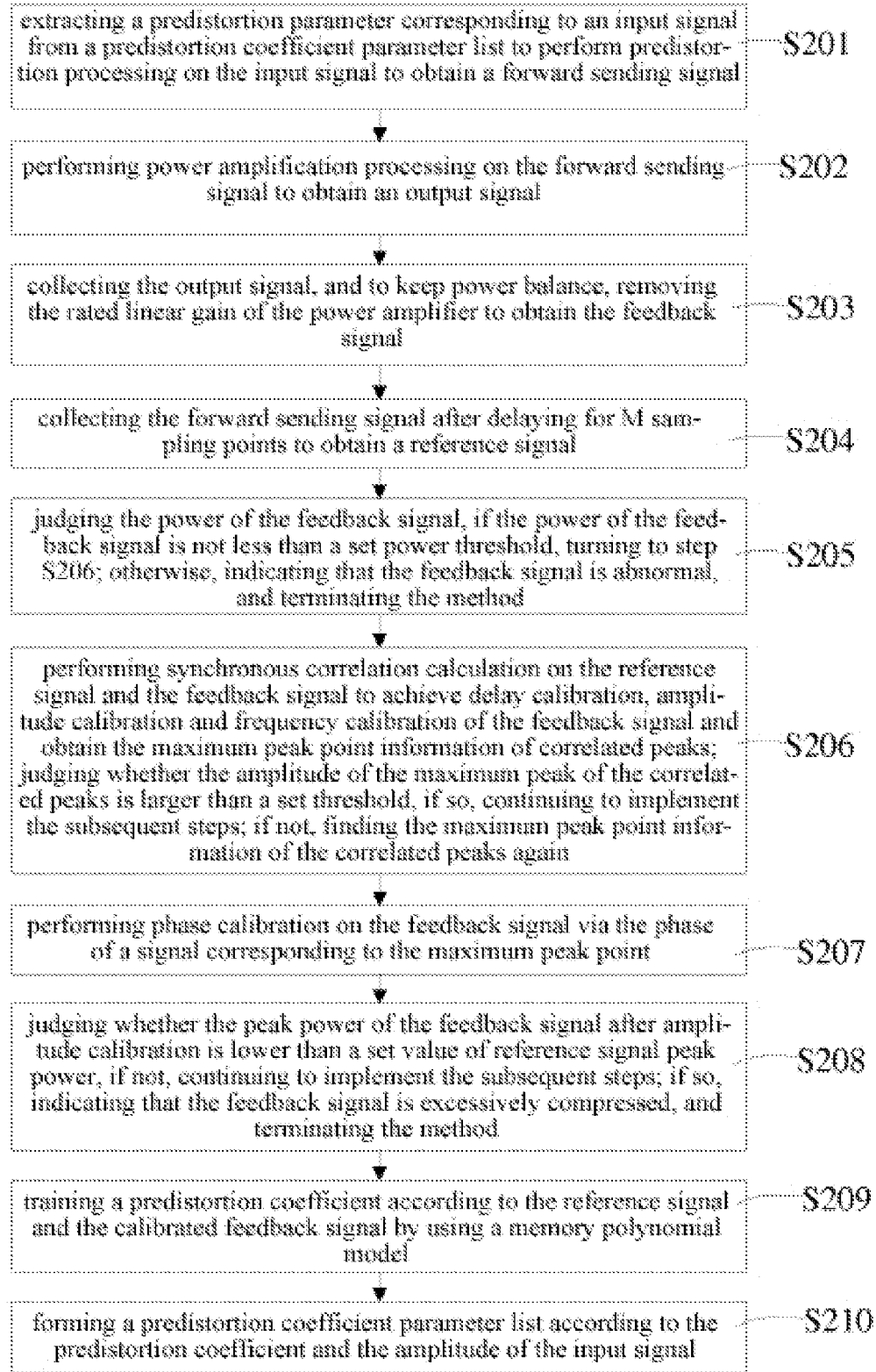
FIG. 2 is a flowchart of another digital predistortion processing method in an embodiment of the present invention.

Embodiment 2:

FIG. 2 is a flowchart of a digital predistortion processing method in this embodiment.

The method in this embodiment includes the following steps:

S201: extracting a predistortion parameter corresponding to an input signal from a predistortion coefficient parameter list to perform predistortion processing on the input signal to obtain a forward sending signal;

S202: performing power amplification processing on the forward sending signal to obtain an output signal;

S203: collecting the output signal, and to keep power balance, removing the rated linear gain of the power amplifier to obtain a feedback signal;

S204: collecting the forward sending signal after delaying for M sampling points to obtain a reference signal, wherein M is an integer from −5 to 5 and is preferably 1 or 2;

S205: judging the power of the feedback signal, if the power of the feedback signal is not less than a set power threshold, turning to step S206; otherwise, indicating that the feedback signal is abnormal, and terminating the method; the power of the feedback signal is generally not lower than −24 dBFS;

S206: performing synchronous correlation calculation on the reference signal and the feedback signal to achieve delay calibration, amplitude calibration and frequency calibration of the feedback signal and obtain the maximum peak point information of correlated peaks, judging whether the amplitude of the maximum peak of the correlated peaks is larger than a set threshold, if so, continuing to implement the subsequent steps; if not, finding the maximum peak point information of the correlated peaks again;

S207: performing phase calibration on the feedback signal via the phase of a signal corresponding to the maximum peak point;

S208: judging whether the peak power of the feedback signal after amplitude calibration is lower than a set value of reference signal peak power, if not, continuing to implement the subsequent steps; if so, indicating that the feedback signal is excessively compressed, and terminating the method;

S209: training a predistortion coefficient according to the reference signal and the calibrated feedback signal by using a memory polynomial model;

S210: forming a predistortion coefficient parameter list according to the predistortion coefficient and the amplitude of the input signal.

This embodiment will be described below in a more specific manner:

for a TDD system, the user may select a certain training sequence by himself and send the same at a guard period (Guard Period, GP) at a segment of length $L_{GP}$,($L_{GP}$:35~85) at the middle of the GP, therefore the training sequence is sent without influencing the sending of different base stations DwPTS or access of user UE, at this time, a code with good correlation is selected for the training sequence. In this embodiment, it is assumed that the length of the training sequence is N, the memory depth is Q and the intermodulation order is K.

In this embodiment, the forward sending signal z(n) of the input signal x(n) after the predistortion processing and the output signal y(n) of the power amplifier has the following relationship:

$$z(n) = \sum_{\substack{k=2l-1 \\ l=1,2,\ldots,\lfloor(K+1)/2\rfloor}} \sum_{q=0}^{Q} a_{k,q} y(n-q)|y(n-q)|^{k-1};$$

wherein, to keep the power balance, the rated linear gain G of the power amplifier in the output signal y(n) needs to be removed to obtain the feedback signal $u_{k,q}^{(n)}$ of each output signal as follows:

$$u_{k,q}(n) = \frac{y(n-q)}{G}\left|\frac{y(n-q)}{G}\right|^{k-1};$$

the matrix of the above-mentioned signal is expressed as follows:

the feedback signal:

$$U=[u_{10},\ldots u_{k0},\ldots u_{1Q},\ldots u_{KQ}], u_{kq}=[u_{kq}(0),\ldots u_{kq}(N-1)]^T$$

the forward sending signal (i.e., the training sequence):

$$z=[z(0),\ldots,z(N-1)]^T;$$

the matrix of the feedback signal obtained by delaying the forward sending signal for M sampling points is expressed as follows:

$$z'=[z(M),\ldots,z(M+N-1)]^T;$$

the delay duration $T_{delay}$ of the feedback signal relative to the reference signal path is approximately:

$$T_{delay} = \tau_{DAC} + \tau_{tx\_rf} + \tau_{TPA} + \tau_{rx\_rf} + \tau_{ADC}$$

wherein, $\tau_{DAC}$ refers to the delay of the signal via the digital to analogue converter; $\tau_{tx\_rf}$ refers to the delay of the signal via the radio frequency transmission channel; $\tau_{TPA}$ refers to the delay of the signal via the power amplifier; $\tau_{rx\_rf}$ refers to the delay of the signal via the radio frequency receiving channel; $\tau_{ADC}$ refers to the delay of the signal via the analogue to digital converter.

Figure 3:
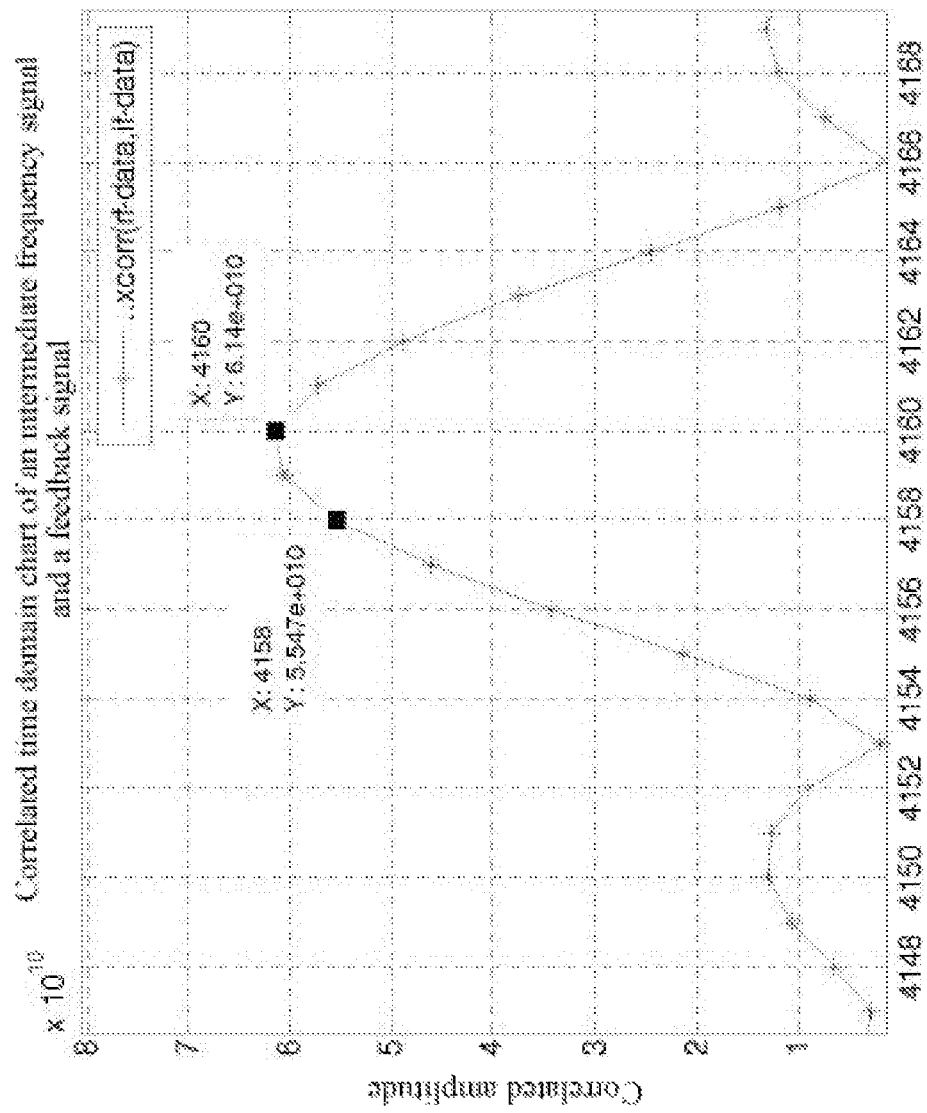
FIG. 3 is a correlated peak chart of a reference signal and a feedback signal in a digital predistortion processing method according to an embodiment of the present invention.
Figure 4:
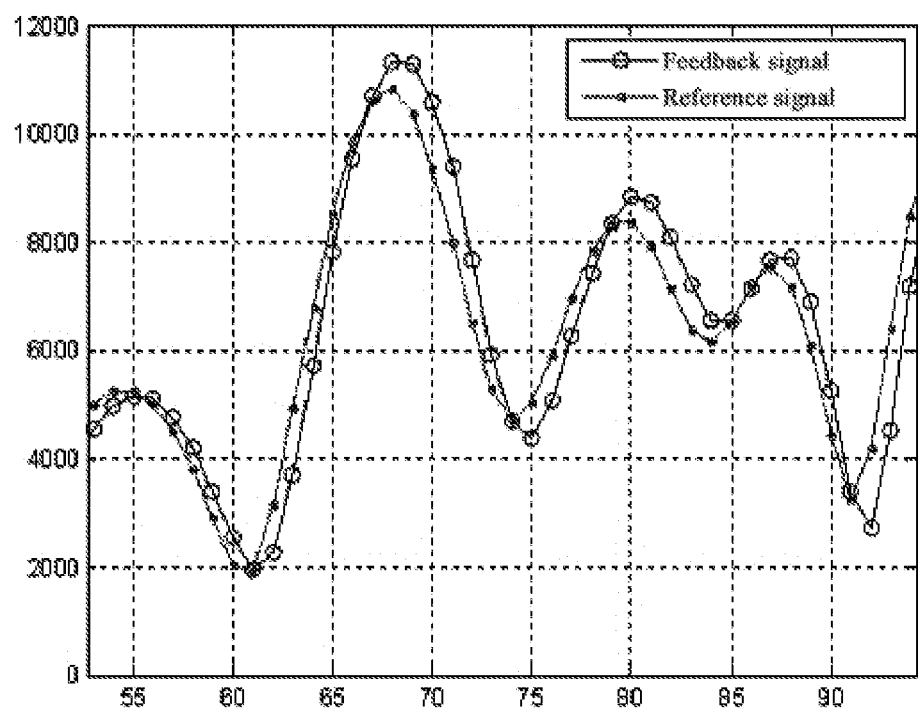
FIG. 4 is a respective correlated peak chart of a reference signal and a feedback signal after delaying for two sampling points in a digital predistortion processing method according to an embodiment of the present invention.

Firstly, different delays of the reference signal and the feedback signal on time are adjusted by correlation, and the amplitude is calibrated. Since the calibration of the delay and the amplitude is the prior art, no repeated description will be given herein;

the correlated maximum peak point information is obtained by the following formula:

$$[max\_data, position] = max(xcorr(y,z'))$$

wherein, xcorr(y, z') refers to correlation operation between the reference signal and the feedback signal; max (xcorr(y, z') refers to obtaining of the maximum value in the correlation operation, thus obtaining the maximum value max_data of the correlated peak and the position information position thereof. As shown in FIG. 3, it is a correlated peak chart of the reference signal and the feedback signal; the maximum value of correlated amplitude is 6.14e+010, and the position is (4160, 6.14e+010). FIG. 4 is a respective correlated peak chart of the reference signal and the feedback signal obtained by sampling the forward sending signal after delaying for two sampling points; if the maximum value max_data of the correlated peak after correlation is lower than a certain threshold, it indicates that the peak is found incorrectly, thus the amplitude of the correlated peak needs to be larger than a certain threshold threshold_cor_value;

$$|max\_data| > threshold\_cor\_value.$$

It is assumed that the peak amplitude of the correlated peak is max_value:

$$max\_value = |max\_data|;$$

the phase angle |max_data| of the signal corresponding to the maximum peak point is used as a calibration phase θ;

$$\theta = angle(max\_data);$$

phase calibration is performed on the feedback signal via the calibration phase;

$$y = y\exp(-j\theta).$$

Figure 5:
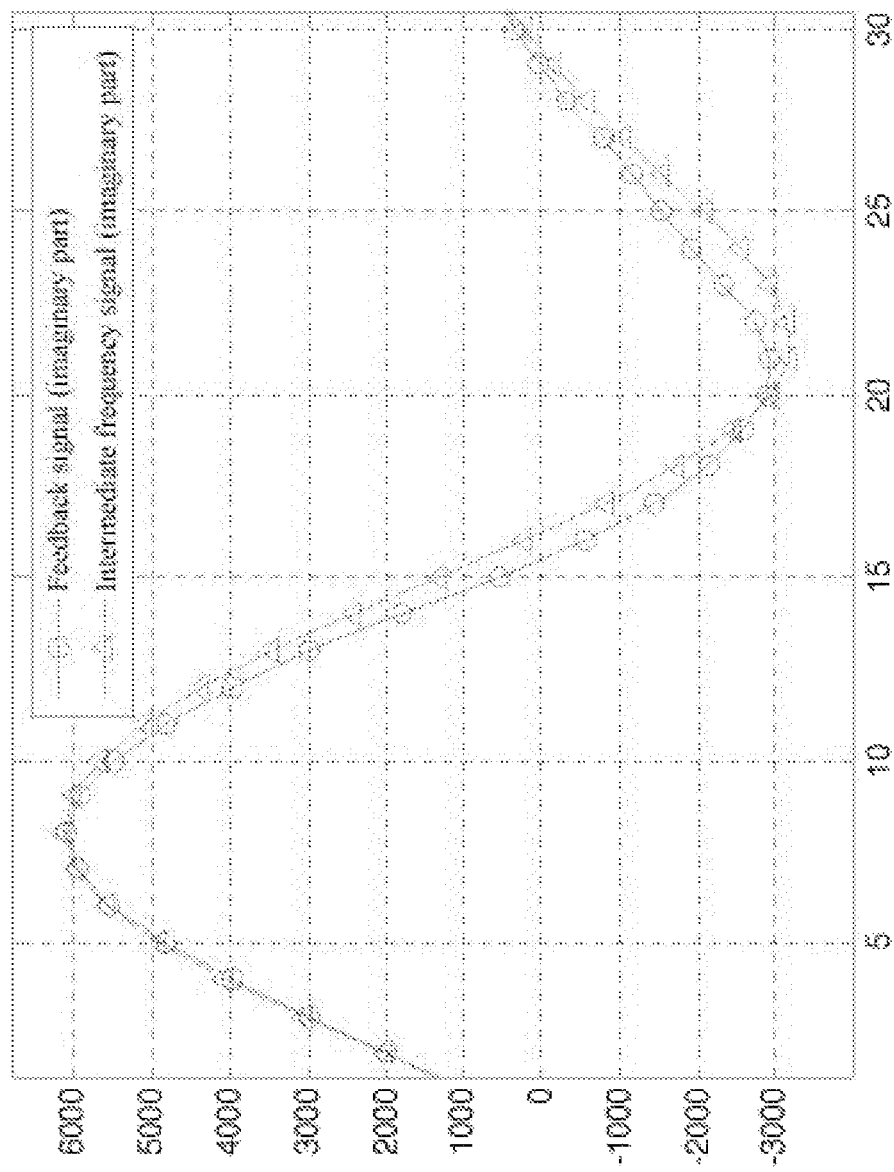
FIG. 5 is a schematic diagram of aligned amplitudes of imaginary parts of a feedback signal and a reference signal before predistortion in a digital predistortion processing method according to an embodiment of the present invention.
Figure 6:
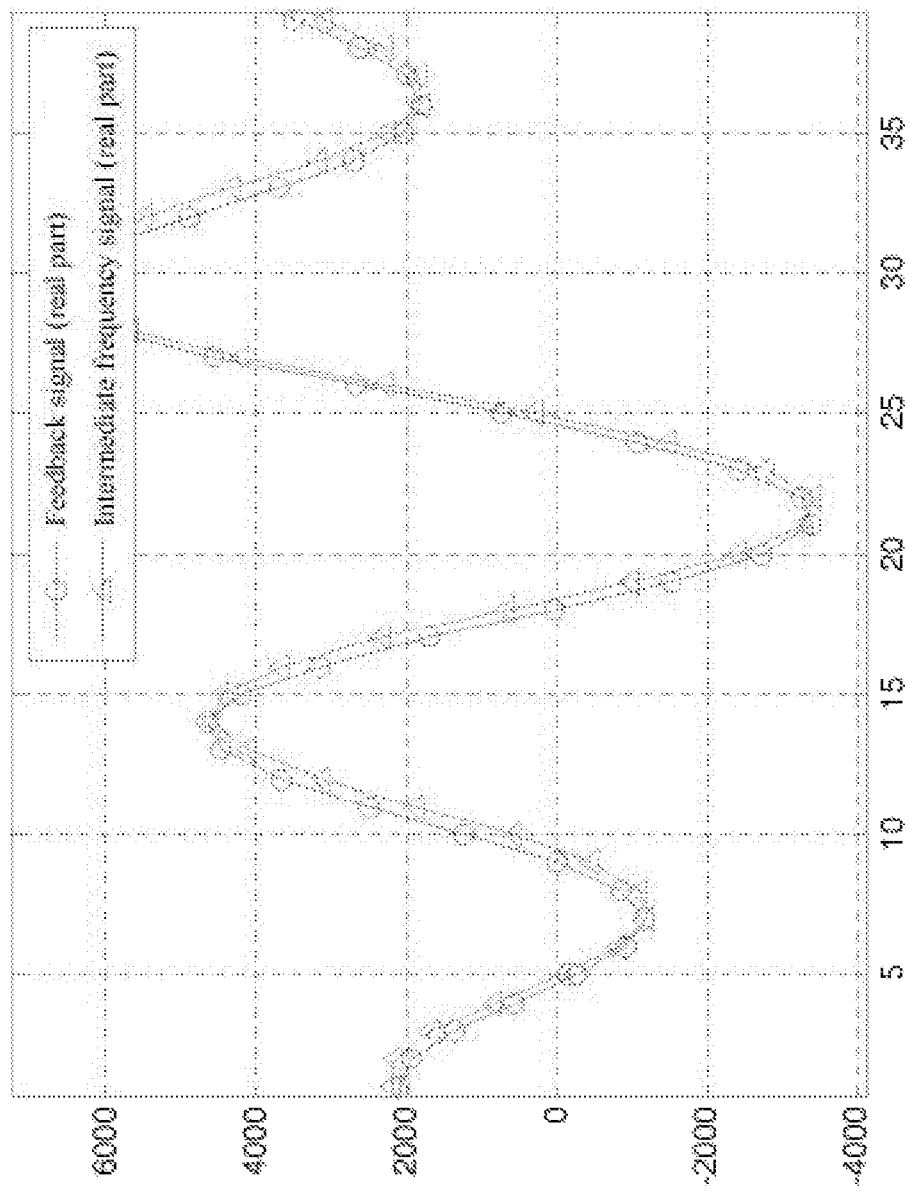
FIG. 6 is a schematic diagram of aligned amplitudes of real parts of a feedback signal and a reference signal before predistortion in a digital predistortion processing method according to an embodiment of the present invention.

In this way, the phase calibration of the feedback signal and the reference signal is completed, such that the amplitudes of the real parts and the imaginary parts of the feedback signal and the reference signal may be aligned before predistortion (as shown in FIG. 5 and FIG. 6), more than power alignment of the signals.

And then, frequency offset is calibrated, in this embodiment, the calibration of the frequency offset is the prior art, thus will not be described in detail herein.

If the peak power amplifier is damaged, peak amplification does not work, resulting in that the peak of the feedback signal is greatly compressed. Whether the peak of the feedback signal is excessively compressed may be judged according to the amplitudes of the feedback signal and the reference signal after amplitude calibration, so as to judge whether the power amplifier is damaged.

Figure 7:
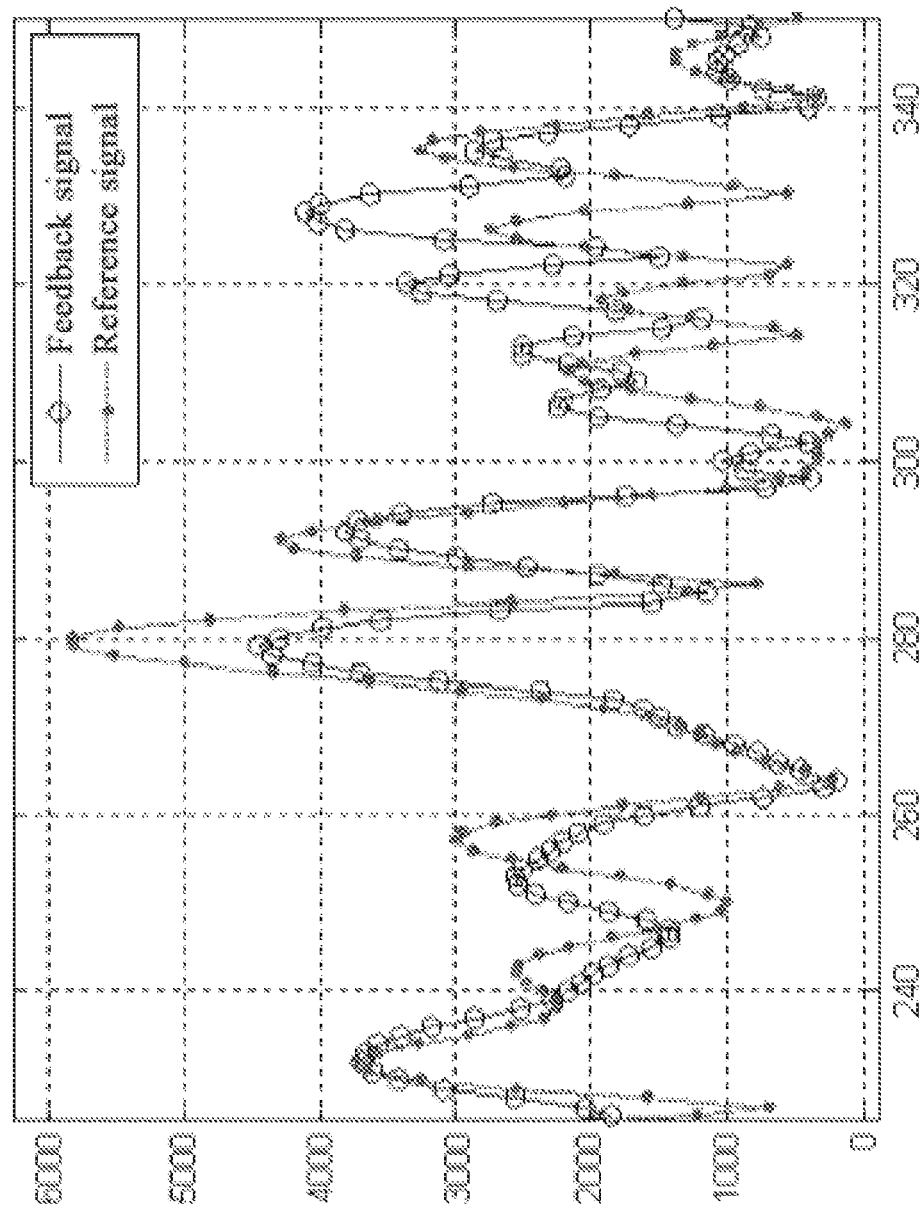
FIG. 7 is a schematic diagram of a condition that peak power compression exceeds 1.5 dBc in a digital predistortion processing method according to an embodiment of the present invention.

After amplitude calibration, the average amplitudes of the feedback signal and the reference signal should be the same. If the peak power of the feedback signal is lower than the training signal peak power 20*log10(1.18)=1.5 dBc, namely, the peak power of the feedback signal is lower than the amplitude (1.18) of average power, it is considered that the feedback signal is abnormal. FIG. 7 shows a condition that peak power compression exceeds 1.5 dBc, at this time, it is indicated that the power amplifier is damaged.

After the above-mentioned calibration is performed on the feedback signal, the predistortion coefficient is trained by a memory polynomial model.

It is assumed that a' is a target DPD coefficient after delayed sampling z'=Ua',
the least square solution â' of a' is:

$$â'=(U^HU)^{-1}U^Hz',$$

$$â'=(U^HU)^{-1}U^H[z(M), \ldots, z(M+N-1)]^T$$

At this time, the predistortion coefficient obtained by delaying the forward sending signal z for M sampling points may better reflect the memory properties of the power amplifier.

Table 1 is comparison of test results before and after performing delayed sampling on the forward sending signal:

TABLE 1

ACPR result after DPD before and after delayed sampling

| | Power (dBm) | ACPR left (dBc) | ACPR right (dBc) |
|---|---|---|---|
| Before delayed sampling | 41.57 | −50.16 | −46.91 |
| After delayed sampling | 41.58 | −51.41 | −47.87 |

It may be seen from the table that, after the delayed sampling, the ACPR effect after DPD is perfected.

In this embodiment, besides delaying the transmission signal for a preset number of sampling points to greatly perfect the radio frequency index ACPR, the phase of the correlated peak point is used as the phase calibration to ensure the phase uniformity of the signals and prevent the phase of the predistortion coefficient from overturning again.

Figure 8:
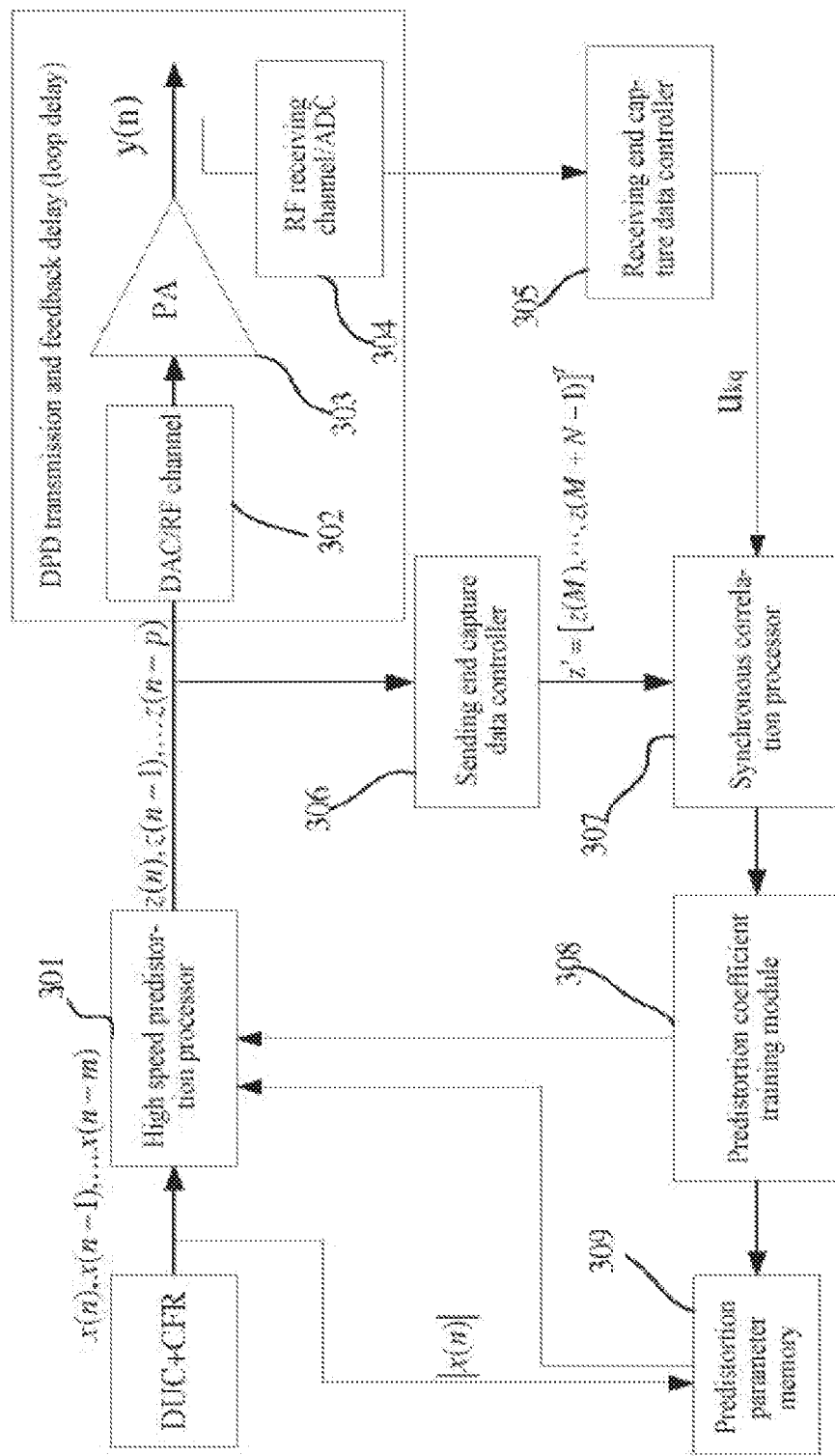
FIG. 8 is a schematic diagram of a structure of a digital predistortion processing system according to an embodiment of the present invention.

Embodiment 3:

FIG. 8 is a schematic diagram of a structure of a digital predistortion processing system recorded in this embodiment, which is used for achieving the method in embodiment 1 or embodiment 2, including:

a predistortion processor 301, configured to extract a predistortion parameter corresponding to an input signal from a predistortion coefficient parameter list to perform predistortion processing on the input signal to obtain a forward sending signal;

a digital to analogue converter and a radio frequency transmission channel 302, configured to perform digital to analogue conversion on the forward sending signal and send the forward sending signal to a power amplifier 303;

the power amplifier 303, configured to perform power amplification on the forward sending signal after digital to analogue conversion to obtain an output signal;

a radio frequency receiving channel and an analogue to digital converter 304, configured to receive the output signal, perform analogue to digital conversion on the output signal and send the output signal to a receiving end capture data controller 305;

the receiving end capture data controller 305, configured to collect the output signal after the analogue to digital conversion to obtain a feedback signal;

a sending end capture data controller 306, configured to collect the forward sending signal after delaying for a preset number of sampling points to obtain a reference signal, and send the reference signal to a synchronous correlation processor 307;

the synchronous correlation processor 307, configured to perform synchronous correlation calculation on the reference signal and the feedback signal, calibrate the feedback signal, and then send the feedback signal to a predistortion coefficient training module 308 together with the reference signal;

the predistortion coefficient training module 308, configured to train a predistortion coefficient according to the reference signal and the calibrated feedback signal, and send the predistortion parameter to a predistortion parameter memory 309 and the predistortion processor 301;

the predistortion parameter memory 309, configured to form a predistortion coefficient parameter list according to the predistortion coefficient and the amplitude of the corresponding input signal.

In this embodiment, the transmission signal is delayed for a preset number of sampling points to greatly perfect the radio frequency index ACPR.

The above-mentioned embodiments are merely used for illustrating the present invention, rather than limiting the present invention. Those of ordinary skill in the related technical art could make a variety of deformations and variations without departing from the spirit and scope of the present invention. Accordingly, all equivalent technical solutions belong to the scope of the present invention, and the patent protection scope of the present invention should be defined by the claims.

The invention claimed is:

1. A digital predistortion processing method, comprising:
   extracting a predistortion parameter corresponding to an input signal from a predistortion coefficient parameter list to perform predistortion processing with a predistortion processor on the input signal to obtain a forward sending signal;
   performing power amplification processing with a power amplifier on the forward sending signal to obtain an output signal;
   collecting the output signal with a receiving end capture data controller to obtain a feedback signal;
   collecting the forward sending signal with a sending end capture data controller after delaying the forward sending signal for a preset number of sampling points to obtain a reference signal;
   performing synchronous correlation calculation with a synchronous correlation processor on the reference signal and the feedback signal to calibrate the feedback signal;
   training a predistortion coefficient with a predistortion coefficient training module according to the reference signal and the calibrated feedback signal; and
   forming the predistortion coefficient parameter list in a predistortion parameter memory according to the predistortion coefficient and the amplitude of the input signal.

2. The method of claim 1, wherein the step of performing synchronous correlation calculation on the reference signal and the feedback signal to calibrate the feedback signal further comprises:
   performing the synchronous correlation calculation on the reference signal and the feedback signal to achieve delay calibration, amplitude calibration and frequency calibration of the feedback signal and obtain the maximum peak point information of correlated peaks; and
   performing phase calibration on the feedback signal via the phase of a signal corresponding to the maximum peak point.

3. The method of claim 2, wherein before performing the synchronous correlation calculation, the method further comprises a step of judging the power of the feedback signal, if the power of the feedback signal is not less than a set power threshold, continuing to implement the step of performing the synchronous correlation calculation; otherwise, indicating that the feedback signal is abnormal, and terminating the method.

4. The method of claim 2, wherein the maximum peak point information of correlated peaks comprises the amplitude of the maximum peak of the correlated peaks, and the step of obtaining the maximum peak point information of the correlated peaks comprises: judging whether the amplitude of the maximum peak of the correlated peaks is larger than a set threshold, if so, continuing to implement the step of performing the phase calibration; if not, finding the maximum peak point information of the correlated peaks again.

5. The method of claim 2, wherein after the step of performing the synchronous correlation calculation to achieve the amplitude calibration of the feedback signal, the method further comprises: judging whether the peak power of the feedback signal after amplitude calibration is lower than a set value of reference signal peak power, if not, continuing to implement the step of training the predistortion coefficient; if so, indicating that the feedback signal is excessively compressed, and terminating the method.

6. The method of claim 1, wherein the step of collecting the output signal to obtain the feedback signal comprises: removing a rated linear gain in the collected output signal to obtain the feedback signal.

7. The method of claim 1, wherein the preset number in the delaying for a preset number of sampling points is an integer from −5 to 5.

8. The method of claim 7, wherein the preset number is 1 or 2.

9. The method of claim 1, wherein the step of training the predistortion coefficient according to the reference signal and the calibrated feedback signal comprises: figuring out the predistortion coefficient by using a memory polynomial model.

10. A digital predistortion processing system, comprising:
a predistortion processor, configured to extract a predistortion parameter corresponding to an input signal from a predistortion coefficient parameter list to perform predistortion processing on the input signal to obtain a forward sending signal;
a digital to analogue converter, configured to perform digital to analogue conversion on the forward sending signal and send the forward sending signal to a power amplifier;
the power amplifier, configured to perform power amplification on the forward sending signal after digital to analogue conversion to obtain an output signal;
an analogue to digital converter, configured to receive the output signal, perform analogue to digital conversion on the output signal and send the output signal to a receiving end capture data controller;
the receiving end capture data controller, configured to collect the output signal after the analogue to digital conversion to obtain a feedback signal; and
a sending end capture data controller, configured to collect the forward sending signal after delaying for a preset number of sampling points to obtain a reference signal, and send the reference signal to a synchronous correlation processor;
the synchronous correlation processor, configured to perform synchronous correlation calculation on the reference signal and the feedback signal, calibrate the feedback signal, and then send the calibrated feedback signal to a predistortion coefficient training module together with the reference signal;
the predistortion coefficient training module, configured to train a predistortion coefficient according to the reference signal and the calibrated feedback signal, and send the predistortion parameter to a predistortion parameter memory and the predistortion processor; and
the predistortion parameter memory, configured to form a predistortion coefficient parameter list according to the predistortion coefficient and the amplitude of the corresponding input signal.

* * * * *